United States Patent [19]

Konishikawa et al.

[11] 4,288,840
[45] Sep. 8, 1981

[54] PRINTED CIRCUIT BOARD

[75] Inventors: Kaoru Konishikawa; Shunsuke Sasaki, both of Hirakata; Kouichi Higuchi, Neyagawa; Fuminori Hirose, Hirakata, all of Japan

[73] Assignee: Matsushita Electric Industrial Co., Ltd., Osaka, Japan

[21] Appl. No.: 77,760

[22] Filed: Sep. 21, 1979

[30] Foreign Application Priority Data

Sep. 26, 1978 [JP] Japan ................. 53-118828

[51] Int. Cl.³ ............................................. H05K 1/18
[52] U.S. Cl. ................................. 361/410; 174/68.5;
361/402; 361/406
[58] Field of Search ............... 174/68.5, 112; 361/402, 361/406, 410

[56] References Cited

U.S. PATENT DOCUMENTS

| 2,984,768 | 5/1961 | Henry | 361/410 |
|---|---|---|---|
| 3,082,327 | 3/1963 | Rice | 174/68.5 X |
| 3,189,978 | 6/1965 | Stetson | 174/68.5 X |
| 3,192,307 | 6/1965 | Lazar | 174/68.5 |
| 3,239,719 | 3/1966 | Shower | 174/68.5 X |
| 3,324,353 | 6/1967 | Retzlaff | 361/410 |
| 3,478,425 | 11/1969 | Cooke | 174/68.5 X |
| 3,615,949 | 10/1971 | Hicks | 174/68.5 X |
| 4,097,685 | 6/1978 | Breuninger | 174/68.5 |
| 4,139,881 | 2/1979 | Shimizu | 361/406 X |

FOREIGN PATENT DOCUMENTS 1444814  8/1976  United Kingdom ............... 361/410

Primary Examiner—Richard R. Kucia
Attorney, Agent, or Firm—Wenderoth, Lind & Ponack

[57] ABSTRACT

An improved printed circuit board for use in electrical and electronic appliances includes an electronic part for a jumper having crossover wiring and disposed on an electrically insulative substrate or base plate for the printed circuit board provided with a cross pattern of conductors in which sets of separated or cut-off conductive layers are arranged to confront each other on X-Y cross coordinates for connecting the cross pattern portions on the substrate to each other by the jumper electronic part.

9 Claims, 12 Drawing Figures

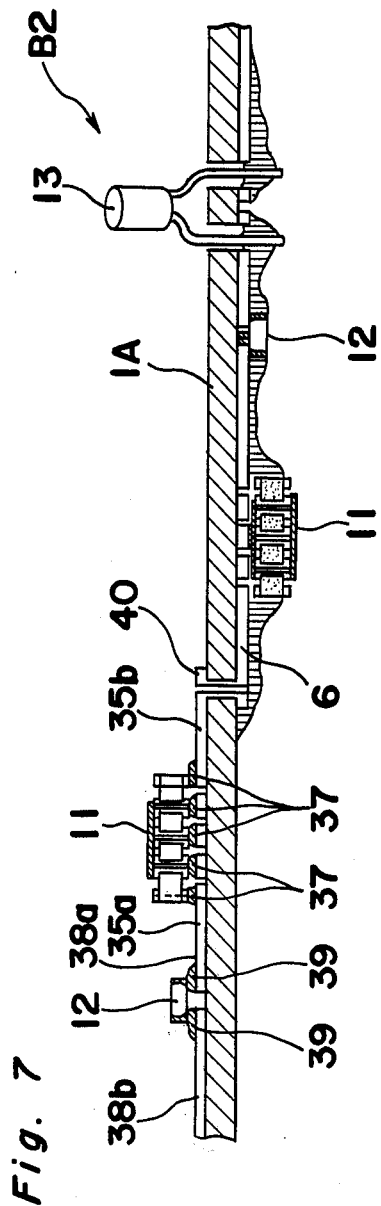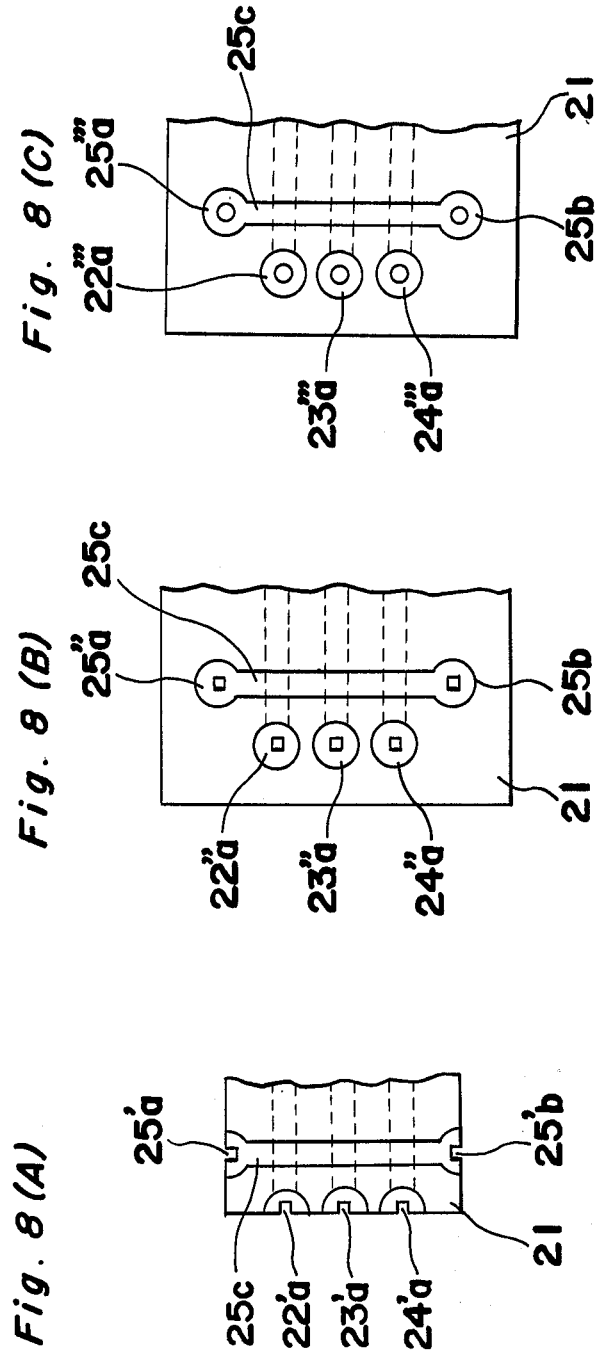

PRINTED CIRCUIT BOARD

BACKGROUND OF THE INVENTION

The present invention relates to a printed circuit board for use in electrical and electronic appliances and more particularly, to a printed circuit board which is arranged to connect cross pattern electrically conductive layers disposed on X-Y cross coordinates on the circuit board by an electronic part or component as a jumper without shortcircuiting therebetween.

Generally, in cases where cross pattern electrically conductive layers are to be crossed over each other on X-Y cross coordinates on a printed circuit board, it has been so arranged as shown in FIG. 1 that one set of conductive layers Ca of sets of conductive layers Ca and Cb which are to be crossed over on the reverse surface of a printed circuit board P is laid or wired continuously without cutting or separation on the way, and the other set of the conductive layers Cb which is to be crossed over the one set of conductive layers Ca is separated or discontinued to be disposed to confront the layers Ca, while jumper electronic parts j are provided between respective confronting portions of the conductive layers Cb through bonding agent b for crossing over by soldering based on the known solder dipping method so as to avoid shortcircuiting between the conductive layers Ca and Cb thus crossed over each other.

The conventional crossover arrangement as described above, however, has such drawbacks that, if the number of cross pattern portions is increased or concentrated on the printed circuit board P, large spaces are occupied thereon by the increased number of the jumper electric parts j, thus reducing spaces for mounting other electronic parts such as leadless chip parts, discrete electronic parts, etc. on the printed circuit board.

Meanwhile, for avoiding an increase of the number of cross pattern portions on the printed circuit board, there has conventionally been proposed another arrangement in which other conductive layers (not shown) are provided for connecting the cut or separated conductive layers Cb of the layers Ca and Cb on the front surface of the printed circuit board P so as to couple such other conductive layers with the conductive layers Cb via through-holes formed in the circuit board P. The known arrangement as described above, however, still has such disadvantages that the connections at the through-holes are undesirably cut off or broken by shock in heating, heating cycles or repeated heatings, etc. during soldering of other electronic parts such as leadless chip parts, discrete electronic parts, etc. to the printed circuit board, thus not being suitable for actual application.

SUMMARY OF THE INVENTION

Accordingly, an essential object of the present invention is to provide an improved printed circuit board in which mounting of other electronic parts such as leadless chip parts, discrete electronic parts, etc. onto the printed circuit board is facilitated through reduction of spaces to be occupied by jumper electronic parts on the printed circuit board even when the number of cross pattern portions, i.e. the quantity of arrangements where one or more electrically conductive layers in the X coordinate cross-over one or more electrically conductive layers in the Y coordinate, is increased.

Another important object of the present invention is to provide an improved printed circuit board of the above described type which is stable while functioning, with a high reliability.

A further object of the present invention is to provide an improved printed circuit board of the above described type which is simple in construction and can be manufactured on a large scale at low cost.

In accomplishing these and other objects, according to one preferred embodiment of the present invention, there is provided a printed circuit board for use in electrical and electronic appliances which comprises a jumper electronic part including a plurality of confronting through-hole conductive members provided at respective confronting edge portions of a first electrically insulative substrate of rectangular plate-like configuration and conductive layers provided on at least one surface of the first electrically insulative substrate for connecting the confronting through-hole conductive members to each other, and a second electrically insulative substrate for the printed circuit board provided thereon with sets of conductive layers crossing on X-Y coordinates in the form of cross conductive member patterns so as to face corresponding ones of the through-hole conductive members of the jumper electronic part, with at least one set of the sets of conductive layers of the second electrically insulative substrate having a conductive member pattern having separations therein. The jumper electronic part is mounted to be soldered on the cross conductive member pattern of the second electrically insulative substrate for connecting the separated conductive member pattern of the conductive layers through crossover wiring.

By the arrangement according to the present invention as described above, not only the area to be occupied by the jumper electronic part on the printed circuit board is advantageously reduced for facilitation of mounting other circuit parts or components on the circuit board, but owing to the soldering of the jumper electronic part at its terminal portions, troubles arising from cut off or breakage at the through-hole conductors are prevented, with a consequent improved reliability in the functioning of the printed circuit board.

BRIEF DESCRIPTION OF THE DRAWINGS

These and other objects and features of the present invention will become apparent from the following description taken in conjunction with the preferred embodiment thereof with reference to the accompanying drawings, in which;

FIG. 7 is a cross sectional view of the modified printed circuit board of FIG. 6, and FIGS. 8(A) to 8(C) are fragmentary top plan views showing further modifications of the jumper electronic part of FIG. 5(A).

Before the description of the present invention proceeds, it is to be noted that like parts are designated by like reference numerals throughout the several views of the accompanying drawings.

DETAILED DESCRIPTION OF THE INVENTION

Figure 2:
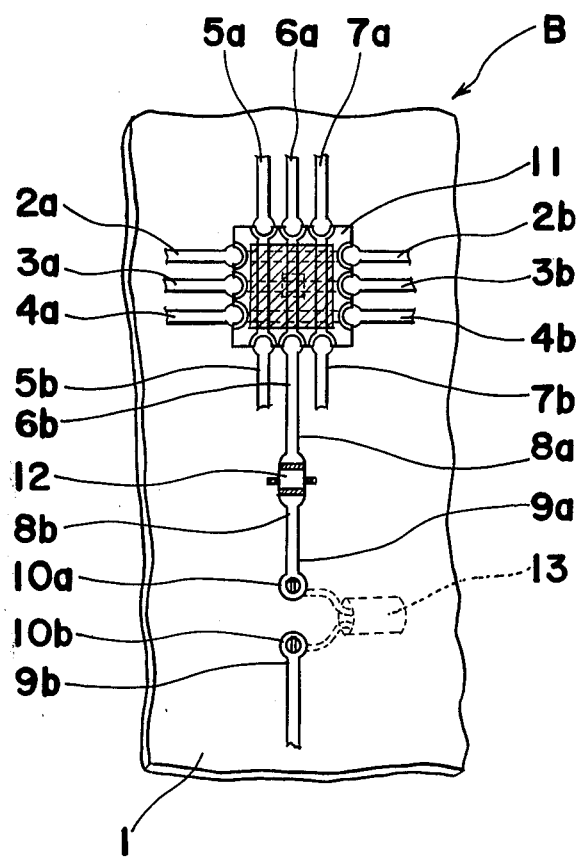
FIG. 2 is a fragmentary top plan view showing the construction of a printed circuit board according to one preferred embodiment of the present invention.
Figure 3:
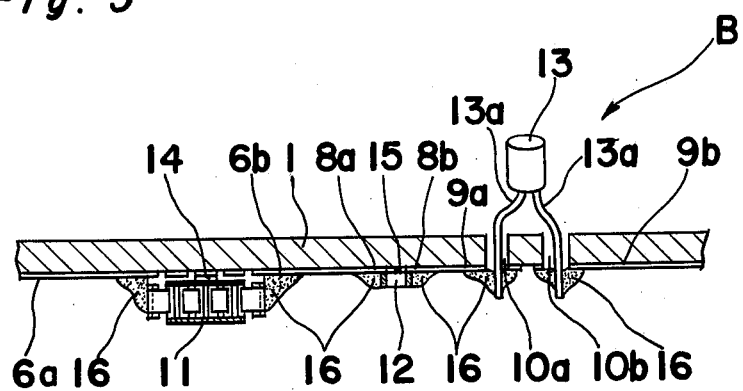
FIG. 3 is a cross section of the printed circuit board of FIG. 2.
Figure 4:
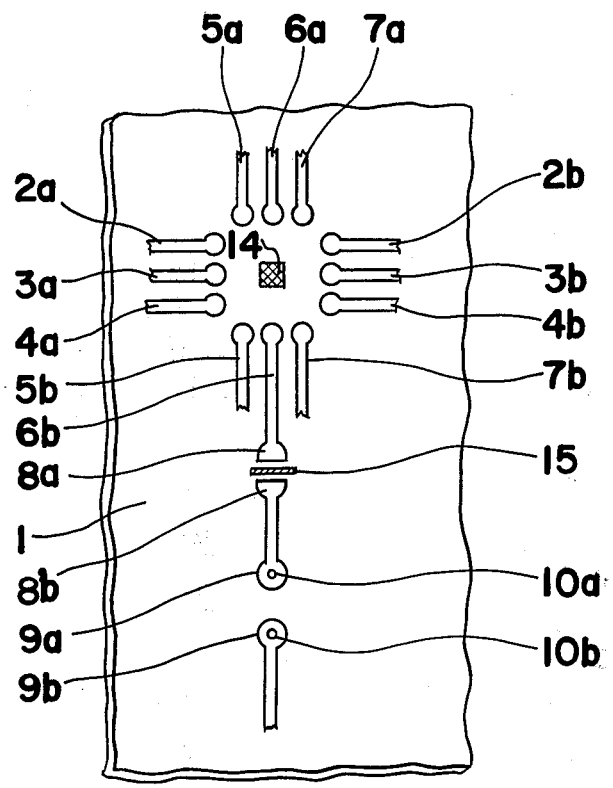
FIG. 4 is a fragmentary top plan view of an electrically insulative substrate employed in the printed circuit board of FIG. 2.

Referring now to the drawings, there is shown in FIGS. 2 to 3 a printed circuit board B according to one preferred embodiment of the present invention which generally includes an electrically insulative substrate or base plate 1, a set of opposed electrically conductive members or layers 2a, 3a and 4a and 2b, 3b and 4b and another set of opposed electrically conductive members or layers 5a, 6a and 7a and 5b, 6b and 7b which are laid or wired on one surface of the substrate 1 so as to be crossed over each other, an electrically conductive layer 8a connected to or integrally formed with the other end of the conductive layer 6b, another conductive layer 8b provided to confront, at its one end, the conductive layer 8a in spaced relation therefrom, still another conductive layer 9a connected to or integrally formed with the other end of the conductive layer 8b, and a further conductive layer 9b laid to confront, at its one end, the conductive layer 9a in spaced relation therefrom as shown. At the corresponding ends of the conductive layers 9a and 9b facing each other, there are respectively formed through-holes or openings 10a and 10b. The conductive layers 2a, 3a and 4a and 2b, 3b and 4b and the conductive layers 5a, 6a and 7a and 5b, 6b and 7b which are to be crossed are respectively spaced from each other so as to confront each other on X-Y coordinates on the substrate 1. In the space defined between the set of the conductive layers 2a, 3a and 4a and 2b, 3b and 4b and the set of the conductive layers 5a, 6a and 7a and 5b, 6b and 7b, there is provided a jumper electronic part 11 for connecting the layers 2a, 3a and 4a and 2b, 3b and 4b and 5a, 6a and 7a and 5b, 6b and 7b, respectively, and a leadless electronic part 12, for example, a resistance chip, a capacitor chip, a miniature molded transistor or the like is connected between the layers 8a and 8b, while a discrete electronic part 13 is coupled between the conductive layer 9a and 9b. For connection, the jumper electronic part 11 and leadless electronic part 12 are temporarily fixed to the surface of the substrate 1 provided with the electrically conductive layers with bonding agents 14 and 15 applied by printing between the conductive layers 2a, 3a and 4a and 2b, 3b and 4b and 5a, 6a and 7a and 5b, 6b and 7b and between the conductive layers 8a and 8b, while the discrete electronic part 13 is first temporarily fixed by inserting its lead wires 13a into the corresponding through-holes 10a and 10b from the surface of the substrate 1 opposite to that formed with the conductive layers, with the tips of the lead wires 13a being subsequently secured to the conductive layers 9a and 9b by solder fillets 16 through solder dipping.

Figure 5:
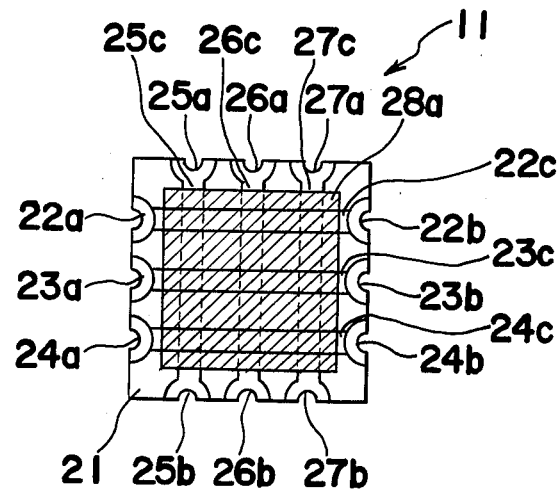
FIG. 5(A) is a top plan view showing, on an enlarged scale, the construction of a jumper electronic part employed in the printed circuit board of FIG. 2.
FIG. 5(B) is a rear side view of the jumper electronic part of FIG. 5(A)
FIG. 5(C) is a cross sectional view of the jumper electronic part of FIG. 5(A)
Figure 5:
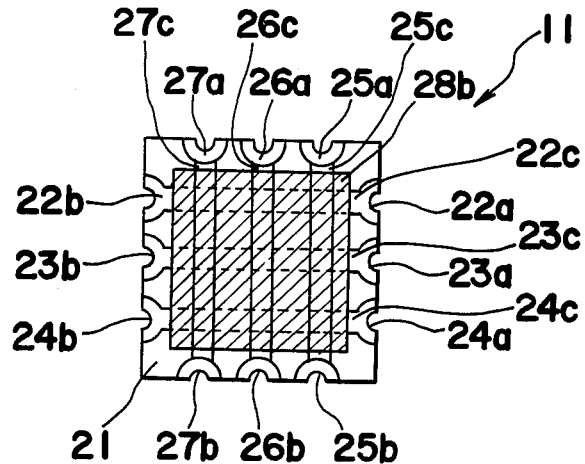
Figure 5:
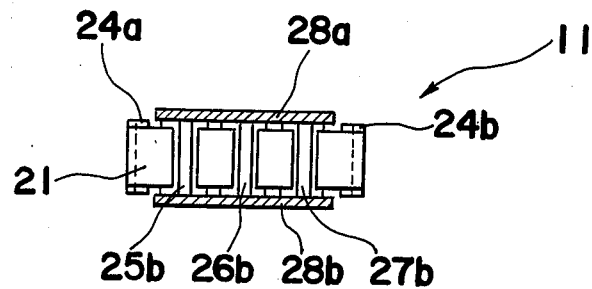

Referring to FIGS. 5(A) to 5(C), the jumper electronic part 11 includes a square or rectangular electrically insulative substrate 21, a set of through-hole electrically conductive members 22a, 23a and 24a and 22b, 23b and 24b and another set of through-hole electrically conductive members 25a, 26a and 27a and 25b, 26b and 27b each having a recess or concave portion of semi-circular cross section formed therein and respectively provided on confronting side edges of the substrate 21, a set of electrically conductive layers 22c, 23c and 24c provided on the front surface of the substrate 21 so as to connect the conductive members 22a, 23a and 24a with the conductive members 22b, 23b and 24b, another set of electrically conductive layers 25c, 26c and 27c provided on the reverse surface of the substrate 21 for connection of the conductive members 25a, 26a and 27a with the conductive members 25b, 26b and 27b, a solder resist layer 28a coated over the conductive layers 22c, 23c and 24c on the front surface of the substrate 21 and another solder resist layer 28b coated over the conductive layers 25c, 26c and 27c on the reverse surface of the substrate 21.

Figure 1:
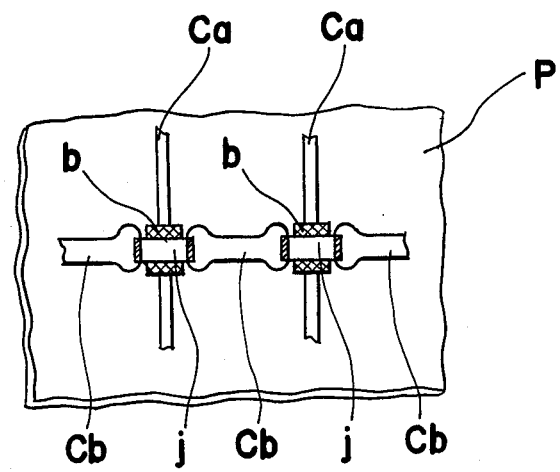
FIG. 1 is a fragmentary top plan view showing the construction of a conventional printed circuit board (previously discussed)

Accordingly, when the jumper electronic part 11 is applied onto the cross pattern portion of the substrate 1 of the printed circuit board B so as to be soldered by the solder dip method, the set of the conductive layers 2a, 3a and 4a and 2b, 3b and 4b of the printed circuit board B are connected to each other by the conductive layers 22c, 23c and 24c on one surface of the jumper electronic part 11, while the other set of the conductive layers 5a, 6a and 7a and 5b, 6b and 7b of the printed circuit board B are connected to each other by the conductive layers 25c, 26c and 27c on the reverse surface of the jumper electronic part 11. As described above, if the cross patterns on the substrate 1 are connected to each other by the use of the jumper electronic part 11 having the crossover wiring, the area to be occupied by the jumper electronic part 11 on the printed circuit board B is reduced as the number of cross pattern portions increases as compared with the case where the single jumper electronic part is employed as in the conventional arrangement of FIG. 1, and thus, the arrangement of FIGS. 2 to FIG. 5(C) of the present invention is quite advantageous when other electronic parts such as leadless chip parts, discrete electronic parts, etc. are to be further mounted on the printed circuit board. Furthermore, since the through-hole conductive members 22a, 23a and 24a and 22b, 23b and 24b, and 25a, 26a and 27a and 25b, 26b and 27b of the jumper electronic part 11 are respectively utilized for connecting the corresponding cross conductive layers 2a, 3a and 4a and 2b, 3b and 4b, and 5a, 6a and 7a and 5b, 6b and 7b of the printed circuit board with the solder fillets 16, even if any one of the through-hole conductive members is broken or cut off due to thermal shock or repeated heating, electrical cut off or breakage is advantageously prevented by the presence of the solder fillets.

Apart from the case where the cross pattern portion on the one side printed circuit board is connected by the jumper electronic part with the crossover wiring as described in the foregoing, the present invention may readily be applicable to the case where the jumper electronic part is utilized for a both side printed circuit board as described hereinbelow.

Figure 6:
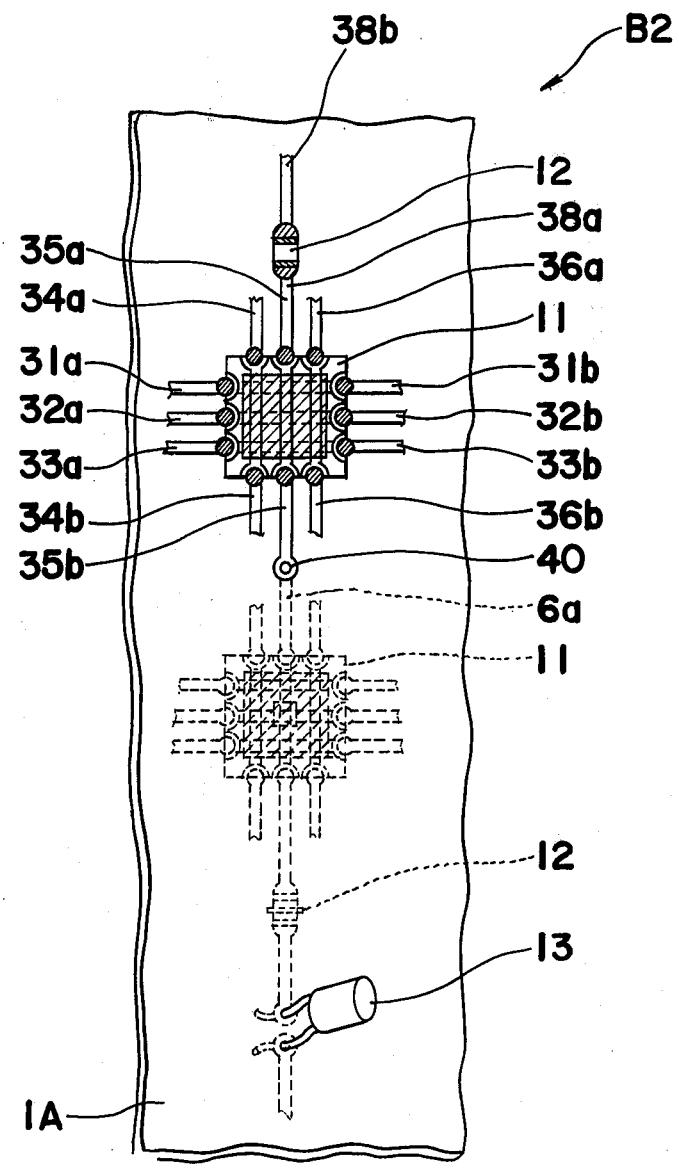
FIG. 6 is a view similar to FIG. 2 which particularly shows a modification thereof.

More specifically, as shown in FIGS. 6 and 7, for the application of the present invention to a both side printed circuit board B2, although the cross pattern portion at the side of the insulative substrate 1A where the leadless chip part 12 and discrete electronic part 13 are to be fixed by the solder fillets 16 through the solder dip method is connected with the jumper electronic part 11 having the crossover wiring by the solder fillets 16 based on the solder dip method, the cross pattern portion at the opposite side of the substrate 1A may be connected by the reflow soldering method. In other words, in the arrangement of FIGS. 6 and 7, on one surface of the insulative substrate 1A, a set of separated conductive layers 31a, 32a and 33a, and 31b, 32b and 33b and another set of separated conductive layers 34a, 35a and 36a, and 34b, 35b and 36b are wired so as to cross on the X-Y coordinates, with solder paste 37 being applied through printing at portions where the conductive layers respectively confront each other (FIG. 7), while solder paste 39 is applied through printing to the conductive layer 38a connected to or integrally formed with the conductive layer 35a and the conductive layer 38b provided to confront conductive layer 38a, and the jumper electronic part 11 and leadless chip part 12 are respectively disposed between the conductive layers 31a, 32a and 33a, and 31b, 32b and 33b and 34a, 35a and 36a and 34b, 35b and 36b, and between 38a and 38b for fixing through calcination by heating of the solder pastes 37 and 39. The conductive layer 6a of the similar arrangement in FIG. 2 on the other surface of the both side printed circuit board B2 and the conductive layer 35b on the one surface thereof may be connected by a through-hole conductive member 40.

Referring also to FIGS. 8(A) to 8(C) showing modifications of the through-hole conductive members for the jumper electronic part 11, the through-hole conductive members 22a, 23a and 24a, and 22b, 23b and 24b, and 25a, 26a and 27a and 25b, 26b and 27b each of arcuate cross section having the semi-circular recessed portion therein and provided as respective terminals of the jumper electronic part 11 in the foregoing embodiment may be replaced by through-hole conductive members 22'a, 23'a and 24'a and 22'b, 23'b and 24'b, and 25'a, 26'a and 27'a and 25'b, 26'b and 27'b each of semi-circular cross section having a half-square recessed portion or groove formed therein as shown in FIG. 8(A), through-hole conductive members 22"a, 23"a and 24"a and 22"b, 23"b and 24"b, and 25"a, 26"a and 27"a and 25"b, 26"b and 27"b each of circular cross section having a square opening or bore formed therein as shown in FIG. 8(B), or through-hole conductive members 22'''a, 23'''a and 24'''a and 22'''b, 23'''b and 24'''b, and 25'''a, 26'''a and 27'''a and 25'''b, 26'''b and 27'''b each of circular cross section having a round opening or bore formed therein as shown in FIG. 8(C).

As is clear from the foregoing description, according to the present invention, since it is so arranged that the jumper electronic part having the crossover wiring is disposed on the insulative substrate provided with the cross pattern conductors in which the sets of separated conductive layers are arranged to confront each other on the X-Y cross coordinates for connecting the cross pattern portions on the substrate to each other by the jumper electronic part, the rate of area to be occupied by the jumper electronic part on the printed circuit board is reduced even when the number of the cross pattern portions increases, and thus, sufficient spaces for mounting other electronic parts such as leadless chip parts or discrete electronic parts can be advantageously obtained. Furthermore, owing to the soldering of the jumper electronic part having the crossover wiring at its terminal portions, even if the terminal portions are formed by the through-hole conductors, the soldered portions act to compensate for possible difficulties due to breakage or disconnection arising from thermal shock or heating cycle imparted to the through-hole conductors. Accordingly, in the arrangement of the present invention, such resulting from breakage of the through-hole conductors can be reduced as compared with the conventional arrangement in which the cross-over wiring is directly effected onto the insulative substrate to be provided with the cross patterns through application of the through-hole technique, with consequent improvements of the reliability of the printed circuit board itself.

It should be noted here that, in the foregoing embodiments, although the present invention has been mainly described with reference to the arrangement in which the cross conductive member patterns including the sets of separated conductive layers which confront each other on the insulative substrate are mutually connected through crossover wiring by the use of the jumper electronic part having the crossover wiring, the concept of the present invention is not limited in its application to the arrangement in the foregoing embodiment, but may readily be applicable to other arrangements, for example, an arrangement in which the crossover conductive member patterns include a first set of separated conductive layers 5a, 6a and 7a and 5b, 6b and 7b and a second set of non-separated or continuous conductive layers 2, 3 and 4 (not shown) passing between the confronting conductive layers 5a, 6a and 7a and 5b, 6b and 7b. In the above case, a jumper electronic part having only the through-hole conductive members 25a, 26a and 27a and 25b, 26b and 27b which are connected through the conductive layers 25c, 26c and 27c need be employed for the crossover wiring between the conductive layers 5a, 6a and 7a and 5b, 6b and 7b of the printed circuit board.

Although the present invention has been fully described by way of example with reference to the attached drawings, it is to be noted that various changes and modifications will be apparent to those skilled in the art. Therefore, unless otherwise such changes and modifications depart from the scope of the present invention, they should be construed as included therein.

What is claimed is:

1. A printed circuit board for use in electrical and electronic appliances, said board comprising a jumper electronic part including a plurality of confronting through-hole conductive members provided at respective confronting edge portions of a first electrically insulative substrate of rectangular plate-like configuration and conductive layers provided on at least one surface of said electrically insulative substrate for connecting said confronting through-hole conductive members to each other, and a second electrically insulative substrate for said printed circuit board provided thereon with sets for conductive layers crossing on X-Y coordinates in the form of a cross conductive member pattern so as to face corresponding ones of said through-hole conductive members of said jumper electronic part, with said conductive layers of at least one set of said sets of conductive layers of said second electrically insulative substrate having therein separations to thus form a separated conductive member pattern, said jumper electronic part being mounted to be soldered on said cross conductive member pattern of said second electrically insulative substrate for connecting to each other said set of separated conductor layers of said separated conductive member pattern through crossover wiring by means of said confronting through-hole conductive members and said conductive layers of said first electrically insulative substrate.

2. A printed circuit board as claimed in claim 1, wherein said jumper electronic part is mounted on said second electrically insulative substrate having said cross conductive member pattern together with other circuit component parts such as a leadless chip part, a discrete electronic part and the like and is simultaneously secured together with said other circuit component parts by dip solder fillets achieved through solder dipping.

3. A printed circuit board as claimed in claim 1, wherein said through-hole conductive members in said jumper electronic part provided in said edge portions of said first electrically insulative substrate each include a concave portion.

4. A printed circuit board as claimed in claim 3, wherein said concave portion is a groove of semi-circular cross section formed in said through-hole conductive member.

5. A printed circuit board as claimed in claim 3, wherein said concave portion is a groove of half-square cross section formed in said through-hole conductive member.

6. A printed circuit board as claimed in claim 3, wherein said concave portion is a through-opening of circular cross section formed in said through-hole conductive member.

7. A printed circuit board as claimed in claim 3, wherein said concave portion is a through-opening of square cross section.

8. A printed circuit board for use in electrical and electronic appliances, said board comprising a jumper electronic part including at least more than one through-hole conductive member provided at each of the side edge portions of a first electrically insulative substrate of rectangular configuration, first conductive layers provided on one surface of said first electrically insulative substrate for connecting to each other the through-hole conductive members provided on one set of confronting said side edge portions of said first electrically insulative substrate and second conductive layers provided on the other surface of said first electrically insulative substrate for connecting to each other the through-hole conductive members provided on the other set of confronting said side edge portions of said electrically insulative substrate for crossover wiring, and a second electrically insulative substrate having thereon a cross conductive member pattern comprising sets of conductive layers crossing on X-Y coordinates so as to confront corresponding ones of said through-hole conductive members of said jumper electronic part, said conductive layers of said sets of conductive layers having therein separations without continuation, said jumper electronic part being mounted to be soldered on said cross conductive member pattern of said second electrically insulative substrate for respectively connecting to each other each said set of separated conductive layers on said second electrically insulative substrate by means of said confronting through-hole conductive members and said connecting conductive layers on a respective said surface of said first electrically insulative substrate.

9. A printed circuit board as claimed in claim 8, wherein said jumper electronic part is mounted on said second electrically insulative substrate having said cross conductive member pattern together with other circuit component parts such as a leadless chip part, a discrete electronic part and the like and is simultaneously secured together with said other circuit component parts by dip solder fillets achieved through solder dipping.

* * * * *